United States Patent
Landa et al.

(10) Patent No.: US 10,780,689 B2
(45) Date of Patent: *Sep. 22, 2020

(54) METHOD AND APPARATUS FOR COATING SELECTED REGIONS OF A SUBSTRATE WITH A FILM

(71) Applicant: Landa Labs (2012) Ltd., Rehovot (IL)

(72) Inventors: Benzion Landa, Nes Ziona (IL); Anton Krassilnikov, Littleton, MA (US); Michael Nagler, Tel Aviv (IL); Moshe Fahima, Rehovot (IL); Nir Rubin Ben Haim, Hod HaSharon (IL); Ofer Aknin, Petach Tikva (IL); Ronen Yogev, Kibutz Hulda (IL)

(73) Assignee: Landa Labs (2012) LTD., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 16/410,390

(22) Filed: May 13, 2019

(65) Prior Publication Data
US 2019/0275786 A1   Sep. 12, 2019

Related U.S. Application Data

(63) Continuation of application No. 15/364,428, filed on Nov. 30, 2016, now Pat. No. 10,336,059, which is a (Continued)

(30) Foreign Application Priority Data

May 27, 2015 (GB) .................................. 1509073.1
May 27, 2015 (GB) .................................. 1509077.2
May 27, 2015 (GB) .................................. 1509081.4

(51) Int. Cl.
*B41J 2/447* (2006.01)
*B41J 2/45* (2006.01)
(Continued)

(52) U.S. Cl.
CPC ............... *B41F 23/00* (2013.01); *B41J 2/447* (2013.01); *B41J 2/45* (2013.01); *B41J 2/455* (2013.01);
(Continued)

(58) Field of Classification Search
CPC .... B41F 23/00; B41J 2/45; B41J 2/447; B41J 2/455; G03G 15/043; G03G 15/342; C23C 16/0209
See application file for complete search history.

(56) References Cited

U.S. PATENT DOCUMENTS 4,435,064 A * 3/1984 Tsukada ................... B41J 2/45
                                                                347/130
5,751,327 A * 5/1998 De Cock ................... B41J 2/45
                                                                165/80.4
(Continued)

FOREIGN PATENT DOCUMENTS

EP  2036734  * 3/2009 ................ B41J 2/45
GB  2034608  * 6/1980 ............ B31F 1/2818
(Continued)

OTHER PUBLICATIONS

Machine translation of JPS5726874.
(Continued)

*Primary Examiner* — Matthew G Marini
*Assistant Examiner* — Marissa Ferguson-Samreth
(74) *Attorney, Agent, or Firm* — Shalom Wertsberger Saltamar innovations

(57) ABSTRACT

Method and apparatus for coating selected regions of a surface of a substrate with a film are disclosed. A cyclically moveable transfer member has an imaging surface which is coated with individual particles formed of, or coated with a thermoplastic polymer, and substantially all particles that are not in direct contact with the imaging surface are removed
(Continued)

so as to leave a uniform monolayer particle coating on the imaging surface. Selected regions of the imaging surface are exposed to radiation to render the particles tacky within the regions, and the coated imaging surface and the substrate are pressed against one another to cause transfer of only the particles rendered tacky in the coating, such that the transferred particles form a film on the substrate. The monolayer on the imaging surface of the transfer member is replenished with fresh thermoplastic particles and the cycle repeats.

20 Claims, 4 Drawing Sheets

Related U.S. Application Data continuation-in-part of application No. PCT/IB2016/053139, filed on May 27, 2016.

(51) Int. Cl.

| B41F 23/00 | (2006.01) |
|---|---|
| B41J 2/455 | (2006.01) |
| G03G 15/043 | (2006.01) |
| G03G 15/34 | (2006.01) |
| C23C 16/02 | (2006.01) |

(52) U.S. Cl.
CPC ....... *C23C 16/0209* (2013.01); *G03G 15/043* (2013.01); *G03G 15/342* (2013.01)

(56) References Cited

U.S. PATENT DOCUMENTS

| 6,469,728 | B1* | 10/2002 | Charnitski | B41J 2/451 347/244 |
|---|---|---|---|---|
| 6,623,816 | B1* | 9/2003 | Tanikawa | B41J 2/0057 347/103 |
| 7,002,613 | B2* | 2/2006 | Beier | B41C 1/05 347/238 |
| 2002/0031645 | A1* | 3/2002 | Sano | B05D 1/00 428/143 |
| 2006/0109440 | A1* | 5/2006 | Willem Herman De Jager | G03F 7/70275 355/53 |
| 2008/0166495 | A1* | 7/2008 | Maeno | B41J 2/0057 427/493 |
| 2009/0009580 | A1* | 1/2009 | Nomura | B41J 2/451 347/238 |
| 2009/0140631 | A1* | 6/2009 | Jo | B41J 2/45 313/498 |
| 2010/0080594 | A1* | 4/2010 | Sowa | G03G 15/043 399/51 |
| 2012/0103212 | A1* | 5/2012 | Stowe | B41C 1/1041 101/147 |
| 2013/0235116 | A1* | 9/2013 | Takemoto | B41J 2/2117 347/20 |
| 2014/0026771 | A1* | 1/2014 | Schlumm | B41F 31/00 101/350.5 |
| 2014/0063161 | A1* | 3/2014 | Liu | G03G 5/022 347/103 |
| 2014/0168330 | A1* | 6/2014 | Liu | B41J 2/01 347/95 |
| 2015/0298467 | A1* | 10/2015 | Cofler | B41J 11/007 347/16 |
| 2015/0352836 | A1* | 12/2015 | Kanasugi | B41J 2/01 347/103 |
| 2017/0072427 | A1* | 3/2017 | Landa | B41F 19/001 |

FOREIGN PATENT DOCUMENTS

| JP | S5557801 | A | | 4/1980 | |
|---|---|---|---|---|---|
| JP | S5726874 | A | | 2/1982 | |
| JP | 60245589 | | * | 12/1985 | ............ B41M 5/124 |
| JP | S6299166 | A | | 5/1987 | |
| JP | 2002254696 | | * | 9/2002 | ................ B41J 2/44 |
| JP | 2006186192 | A | | 7/2006 | |
| JP | 2008074052 | A | | 4/2008 | |
| JP | 2008-194897 | | * | 8/2008 | ................ B41J 2/44 |
| JP | 2009056795 | A | | 3/2009 | |
| JP | 2009149051 | A | | 7/2009 | |
| JP | 2009158477 | A | | 7/2009 | |

OTHER PUBLICATIONS

Machine Translation of JP2009056795A.
Machine Translation of JPS5557801A.
Machine Translation of JP2009149051.
Machine Translation of JP2008074052A.
Machine Translation of JP2006186192.
Machine Translation of JPS6299166A.
Machine Translation of JP2009158477A.

* cited by examiner

METHOD AND APPARATUS FOR COATING SELECTED REGIONS OF A SUBSTRATE WITH A FILM

RELATED APPLICATIONS

This Patent Application incorporates by reference in their entirety U.S. patent application Ser. Nos. 15/364,428, filed on Nov. 30, 2016, 15/363,129 and 15/363,520, filed on Nov. 29, 2016, International Patent Applications Nos. PCT/IB2016/053137, PCT/IB2016/053138 and PCT/IB2016/053139, filed on May 27, 2016, and Great Britain Patent Applications Nos. 1509073.1, 1509077.2 and 1509081.4, filed on May 27, 2015.

FIELD

The present disclosure relates to a printing method and apparatus for coating selected regions of a surface of a substrate with a film of a thermoplastic material.

BACKGROUND

Typewriters are known that employ a ribbon carrying a polymeric ink film. The ribbon is equivalent to the ink ribbon used in a conventional typewriter and ink in the shape of a printing character is transferred from it onto a substrate (usually paper) not by impact but by a printing head that heats only the regions of the ribbon from which the ink is to be transferred to the paper. After a character has been printed, the typewriter carriage is advanced for printing the next character and the ribbon is advanced.

Such typewriters achieve high quality printing but are wasteful, and therefore costly to operate, because at the time that a ribbon needs to be discarded, most of its surface is still coated with ink that has not been transferred to a printing substrate.

OBJECT

The aim of the present disclosure is inter alia to provide a printing apparatus and method that operate on the same principle of transferring a thermoplastic film to the printing substrate but that is less wasteful, capable of printing images of high quality and not restricted to printing text.

SUMMARY

In accordance with one aspect of the disclosure, there is herein disclosed a method of printing a film onto selected regions of a surface of a substrate, which method comprises the steps of:
a) providing a moveable transfer member having an imaging surface,
b) coating the imaging surface of the transfer member with individual particles formed of, or coated with, a thermoplastic polymer,
c) removing substantially all particles that are not in direct contact with the imaging surface to leave a uniform monolayer particle coating on the imaging surface,
d) exposing selected regions of the coated imaging surface to radiation of sufficient power to render the particles tacky within the selected regions,
e) pressing at least a portion of the coated imaging surface and at least a corresponding portion of the substrate surface against one another, either during or after irradiation, to cause transfer to the surface of the substrate of only the regions of the particle coating that have been rendered tacky, the tacky regions forming a film, and
f) replenishing the monolayer of particles at least to the selected regions from which the previously applied monolayer coating was transferred to the substrate surface in step e), to leave the imaging surface again uniformly coated with a monolayer of particles.

In certain situations, such as particle type change, contamination, and the like, it is beneficial to remove the particles from the entire surface of the transfer member or a region thereof prior to replenishment. Similarly, certain imperfections may occur that will unintentionally remove particles from regions of the imaging surface other than those regions which were irradiated and transferred their particles to the substrate. In such situations the particle monolayer is replenished not only to the depleted regions, but to a larger portion of the imaging surface, as needed to obtain a uniform monolayer for continued satisfactory system operation.

In certain embodiments, steps b) and c) may comprise
directing a gas jet carrying the particles onto the imaging surface,
rubbing the particles onto the imaging surface using a cloth, brush or an application roller,
forming the imaging surface and the particles of a hydrophobic material and directing a liquid jet containing the particles onto the imaging surface, the liquid of the jet being selected so as not to wet the imaging surface,
directing onto an intermediate applicator a gas or liquid jet containing the particles, the applicator being capable of receiving the particles and transferring them to the imaging surface, or
any suitable combination of the above-mentioned techniques and structures.

In accordance with a second aspect of the disclosure, there is provided a printing apparatus for printing a film made of a thermoplastic material onto selected regions of a surface of a substrate, the apparatus comprising
a) a cyclically moveable endless transfer member having an imaging surface,
b) a coating station at which particles made of, or coated with, a thermoplastic polymer are applied to the imaging surface and at which particles not in direct contact with the imaging surface are removed, so that a substantially uniform monolayer particle coating is formed on the imaging surface,
c) an imaging station at which selected regions of the coated imaging surface are exposed to radiation of sufficient power to render the particles tacky within the selected regions, and
d) an impression station at which at least a portion of the coated imaging surface and at least a corresponding portion of the surface of the substrate are pressed against one another, either during or after irradiation, to cause transfer to the surface of the substrate of a tacky film formed on the selected regions of the imaging surface by exposure of the monolayer particle coating to radiation,
wherein during operation, after at least a portion of the transfer member having passed through the imaging and impression stations, at least that portion of the transfer member is returned to the coating station wherein the particle coating on the imaging surface is replenished to a uniform monolayer, so as to ready the transfer member to the next cycle.

In the present disclosure, the afore-described apparatus may also be interchangeably referred to as a printing apparatus or a printing system. The imaging surface may also be referred to and regarded as a donor surface.

The terms "tacky" and "sufficiently tacky" as used herein are not intended to mean that the particle coating is necessarily tacky to the touch but only that it is softened sufficiently to enable its adhesion to the surface of a substrate when pressed against it in the impression station 18. The tacky particles or regions of particles rendered tacky are believed to form individual films or contiguous films which following their transfer to a printing substrate may optionally yield thinner films, as a result of the pressure being applied upon contacting of the imaging surface to the substrate and/or of the optional further processing (e.g., drying, curing, etc.) of the transferred films.

In some embodiments, in the coating station, the particles may be directly applied to the imaging surface by jetting, for instance by using one or more spray heads. In alternative embodiments, the particles may be applied to an intermediate applicator and from it to the imaging surface. The latter type of application is said to be indirect and both direct and indirect application of particles to the imaging surface are encompassed in the present disclosure. It is to be understood that direct or indirect application of particles to the imaging surface may take place for the initial coating of the imaging surface with a monolayer of individual particles or for the replenishment of the monolayer in selected regions (e.g., previously depleted by transfer or scraping of the entire surface), or for both.

In order to facilitate repair of the particle coating on the imaging surface after each impression, particles which adhere to the imaging surface more strongly than they do to one another are utilized. This results in an applied layer which is substantially a monolayer of individual particles. Stated differently, the layer is only one particle deep over a major proportion of the area of the imaging surface and most, if not all, of the particles have at least some direct contact with the imaging surface.

By way of example, a platelet shaped particle contacting the imaging surface over most of its planar face (e.g., being substantially parallel to the surface), the resulting thickness of the monolayer (in the direction perpendicular to the surface) would approximately correspond to the thickness of the particle. If the particles have a globular shape, then the thickness of the monolayer will be commensurate with the diameter of the sphere. Hence the average thickness of a monolayer at the time of coating of the imaging surface can be approximated by the average thickness or equivalent diameter of the individual particles forming it, depending on their shape.

However, as there could be partial overlaps between adjacent particles, the thickness of the monolayer can also amount to a low multiple of the dimension of the constituting particles, depending on the type of overlap, for instance on the relative angles the particles may form with one another and/or with the imaging surface and/or the extent of the overlap and/or the extent of packing etc. A monolayer may therefore have, in only some regions, a maximum thickness (T) corresponding to about one-fold, or about two-fold, or about three-fold, or any intermediate value, of a thinnest dimension characteristic to the particles involved (e.g., up to three-fold the thickness of the particles for flake shaped ones and up to two-fold the particle equivalent diameter of near spherical ones).

The creation of the monolayer occurs for the same reason that an adhesive tape, when used to pick up a powder from a surface, will only pick up one layer of powder particles. When the adhesive tape is fresh, the powder will stick to the adhesive until it covers the entire tape surface. However, once the adhesive has been covered with powder, the tape cannot be used to pick up any more powder because the powder particles will not stick strongly to one another and can simply be brushed off or blown away from the tape. Similarly, the monolayer herein is formed from the particles in sufficient contact with the imaging surface and is therefore typically a single particle thick. Contact is considered sufficient when it allows the particle to remain attached to the imaging surface at the exit of the coating station, e.g., following surplus extraction, drying, or any other like steps, which are described in more detail herein.

Though the monolayer is believed to be formed essentially from particles in direct contact with the imaging surface, some particles may become tightly packed by adjacent particles and might remain part of the monolayer at the exit side of the coating apparatus even if not in direct contact with the imaging surface, possibly mildly protruding from the layer. Conceivably, a portion of such minority of non-surface contacting particles may differently absorb radiation, and could eventually transfer to a printing substrate as a result of their cohesivity with adjacent particles, which would be exposed to a greater extent to the intended "energy dose" or effect of the received radiation. In some embodiments, in any portion or field-of-view, the percentage of particles having no direct contact with the imaging surface out of the number of particles being in contact with this surface is of 15% or less, or of less than 10% or even of less than 5%.

In some embodiments, the monolayer of individual particles on the imaging surface forms a sufficiently continuous layer of particles. The monolayer is sufficiently continuous if upon exposure to radiation at the imaging station, the adjacent particles can fuse to form a transferable film. In such embodiments, and depending on the size and shape of the particles forming the monolayer, an area coverage of at least about 40%, and at most about 50%, or at most about 60%, or even at most about 70%, may suffice. For smaller particles and/or for particles having a relatively lower ability to expand radially upon exposure to radiation, the monolayer of particles on the imaging surface may need to form a substantially continuous layer. By "substantially continuous" it is meant that at least 70% of the area is covered by particles, or at least 80%, or at least 90%, or even at least 95%.

Considering by way of example a particle being an ideal sphere having a diameter of 2 μm, such particle would therefore have an initial volume of about 4.19 μm³ and a planar projection of about 3.14 μm². Assuming now that upon radiation exposure such a particle melts to form a disc of the same volume but having a thickness of about 0.5 μm, then such a disc would have a diameter of about 3.3 μm, covering an area of about 8.38 μm².

For the sake of clarity, the actual thickness of the film would be governed by the surface tension properties of the merged liquefied particles relative to air, the wetting properties of this liquid relative to the imaging surface, according to the following equation:

$$t = (2\gamma_{la}(1-\cos\theta)/g\rho)^{1/2} \quad \text{(Eq. 1)}$$

where t is the resulting film thickness, $\gamma_{la}$ is the surface tension between the liquefied particles and air, θ is the wetting angle of the merged liquefied particle relative to the imaging surface, g is the gravitational constant and ρ is the density of this liquid. It should be understood that the surface tension and the wetting angle are both dependent on the temperature of the liquid.

Using the illustrative example and assuming now for simplicity a squared surface having an area of 100 µm², about twelve such melt particles would be needed (assuming substantially even distribution) to form a contiguous film about 0.5 µm thick on such a surface. In their original shape, prior to exposure to radiation, these twelve particles would only cover about 38% of the square. Notably, these values and calculations are provided by way of simplified illustration and persons skilled in the art of film forming polymers can readily appreciate the factors which may affect operating situations.

Clearly the initial area coverage, which needs to be such that a transferable film, possibly a contiguous one, is ultimately formed, depends, among other things, on the size distribution of the particles, on the specific material used for the particles, on their specific rheological parameters, such as temperature dependent surface tension, viscosity and temporal fluid behavior, and like factors depending on the chemical and/or physical properties of the particles per se. Properties of the imaging surface may also contribute to this matter (e.g., facilitating or hampering sufficient contact and/or spreading to contiguity). Additionally, specific process parameters, such as the operating conditions of the coating station, the distribution of the particles on the imaging surface (an essentially homogeneous one being advantageous), the energy density of the radiation received by the particles and/or imaging surface at the imaging station, the pressure at the transfer point at the impression station, can also affect the end-result (e.g., facilitating the spreading and/or merging of the irradiated particles so as to create a film of a desired thickness) thus modify the prerequisites.

The percentage of an area covered by particles out of a specific target surface (% coverage) can be assessed by numerous methods known to skilled persons, including by determination of optical density possibly in combination with the establishment of a calibration curve of known coverage densities, by measurement of transmitted light if either the particles or the substrate are sufficiently transparent, or conversely, by measurement of reflected light, for instance if the particles are reflective (e.g., comprising a reflective material coated by a thermoplastic polymer).

A method of determining the percentage area of a surface of interest covered by particles is described infra. Squared samples having 1 cm edges may be cut from the surface being studied (e.g., from the imaging surface or from the printed substrate). The samples may then be analyzed by microscopy (such as laser confocal microscopy or optical microscopy) at a magnification of up to ×100. At least three representative images shall preferably be captured in reflectance mode for each sample having an opaque substrate (e.g., paper). The captured images may be analyzed using an image processing program. A threshold value of reflectance is selected to differentiate between the reflective particles (lighter pixels) and the interstices that may exist between neighboring or adjacent particles (such voids appearing as darker pixels). The threshold value may be selected manually, or automatically and optionally manually adjusted. The image analysis program may then proceed to measure the amount of pixels representing the particles and the amount of pixels representing the uncovered areas of the intra-particle voids, from which the percent area of coverage can be readily calculated. Measurements done on the different image sections of the same sample can then be averaged.

When the samples are on a transparent substrate (e.g., printed on a translucent or transparent plastic foil), a similar analysis may be done in transmittance mode, the particles appearing as darker pixels and the voids as lighter ones. Results obtained by such method, or by any satisfactory analytical techniques, for optical surface coverage determination, can be expressed as a percentage or as a ratio.

In some embodiments, the polymer film resulting from the conversion of the monolayer of particles by exposure to radiation has a thickness of 2 µm or less, or of less than 1 µm, or even of less than 750 nm. In other embodiments, the thickness of the polymer film is of 100 nm or more, or of more than 200 nm, or even of more than 300 nm. The thickness of the polymer film may be in the range of 300 nm-1,000 nm, or of 500 nm-1,500 nm, or of 600 nm-800 nm, or of 700 nm-1,000 nm.

The thermoplastic particles have a particle size of less than 10 µm, or less than 5 µm, or less than 1 µm, or within the range of 100 nm to 4 µm, or 300 nm to 1 µm, or 500 nm to 1.5 µm.

For assisting in the transfer of the tacky film of particles from the imaging surface to the substrate, the imaging surface may be hydrophobic.

Advantageously, the imaging surface is compatible with the radiation intermittently generated by the imaging station to expose desired selected areas. By compatible, it is meant for instance, that the imaging surface is relatively resistant and/or inert to the radiation at the irradiated frequency range, and/or able to absorb or reflect the radiation, and/or able to conduct or insulate the heat that can be generated by the radiation.

In some embodiments, the thermoplastic particles may themselves be hydrophobic.

In some embodiments, the thermoplastic particles and/or the imaging surface can alternatively and additionally achieve desired relative affinity one to another (and to any other fluid or surface suitable for a printing process according to present teachings) by way of charge-based interactions. For instance, positively charged particles may favor negatively charged surfaces.

The coating station may suitably comprise:
- at least one spray head for applying directly or indirectly to the imaging surface a fluid stream within which the thermoplastic particles are suspended,
- a housing surrounding the spray head(s) and defining an interior plenum for confining the fluid stream, the housing having a rim adjacent the imaging surface that is configured to prevent egress of particles from a sealing gap defined between the rim of the housing and the surface to be coated, and
- a suction source connected to the housing to extract from the plenum the sprayed fluid and particles suspended in the sprayed fluid, the suction source being operative to extract substantially all particles that are not in direct contact with the imaging surface, so as to leave only a single particle layer adhering to the imaging surface on exiting the apparatus.

The coating station may optionally further comprise temperature controlling elements such as a heater and/or a cooler, so as to desirably adjust the temperature of the imaging surface.

In one embodiment, the temperature of the imaging surface can be raised above ambient temperature, the temperature increase being brought about by a heater. In some embodiments, the heater is positioned on the exit side or downstream of the coating station. In such embodiments, the temperature of the outer surface of the imaging surface can be greater than 30° C., or greater than 40° C. or even greater than 50° C., but typically lower than 80° C., or even no more than 70° C.

In some embodiments, the temperature of the imaging surface may be lowered, the temperature reduction being brought about by a cooler, such as a cold air blower or a cold plate, by way of example. The cooler may be positioned on the entry side or upstream of the coating station. In such embodiments, the temperature of the outer surface of the imaging surface can be less than 40° C., or less than 30° C., or even less than 20° C., but typically above 0° C., or even above 10° C.

In some embodiments, the imaging surface is cooled prior to arriving at the coating station and heated after leaving the coating the station.

In the present disclosure, the term "suspended" and its variations do not refer to any particular type of mixture of materials of same or different phase, but are to be more generally understood as "carried" and like terms.

In certain embodiments the imaging system may comprise a device for projecting individually controllable laser beams onto the imaging surface as the imaging surface moves in a reference X-direction relative to the device, the device including a plurality of semiconductor chips mounted on a support in such a manner that, when activated continuously, the emitted laser beams trace across the imaging surface a set of parallel lines that extend in the X-direction and are substantially uniformly spaced in the Y-direction.

In some embodiments, each semiconductor chip of the imaging device comprises a plurality of individually controllable laser beam emitting elements arranged in a two dimensional main array of M rows and N columns (M·N), the elements in each row having a uniform spacing $A_r$ and the elements in each column having a uniform spacing $a_c$, the imaging device further comprising a lens system for focusing the emitted laser beams onto the particle coated imaging surface. The lens system can have a plurality of lens elements, each associated with a respective one of the chips, and may comprise, in some embodiments, a gradient-index (GRIN) rod.

In some embodiments, the chips are mounted on a support in such a manner that when nominally placed, each pair of chips that are adjacent one another in a reference Y-direction, transverse to the X-direction, are offset from one another in the X-direction, and such that the center of laser beam emitting elements from the main arrays of both chips in the pair are nominally uniformly spaced in the Y-direction, without overlap in the Y-direction between the beam emitting elements of the adjacent chips. Stated differently, were all the laser emitting elements of the pair of nominally placed adjacent chips to be activated continuously, and the chips and imaging surface be in relative motion in the X-direction, the emitted laser beams of the respective main arrays of the two chips of the pair would trace on the imaging surface a set of parallel lines that extend in the X-direction and that are nominally uniformly spaced in the Y-direction. The lines traceable by emitting elements of the first chip would not interlace with the lines traceable by emitting elements of the second chip.

As absolute alignment accuracy is expensive and often impractical, it is important to realize that placement terms relate to the desired positioning within certain tolerances that enables satisfactory results from the imaging device and from the printing device. Therefore, the term "nominally", should be construed to denote the desired spatial relationship when the chips or other relevant elements are disposed at their intended placing. However, different aspects of the invention allow for displacements that diverge from that nominal position within such tolerance, and for compensating for such displacement. Similarly, when used to indicate spatial relationship the term "beam" should be considered as relating primarily to the center of the beam, unless otherwise indicated or clear from the context. Thus by way of example the uniform spacing $A_r$ and $a_c$ relate to the distance between the centers of the laser beam emitting elements.

In some embodiments, In order to compensate for minor misalignment, in addition to the M rows and N columns of elements of the main array, each chip comprises at least one additional column on at least one side of the main array, each such additional column containing at least one selectively operable laser emitting element disposed for tracing at least one additional line that lies between the two sets of M·N lines. This element, also termed the additional element or the alignment element, is thus capable of compensating for some misalignment in the Y-direction in the relative positioning of the adjacent chips on the support. If adjacent chips are correctly aligned, the elements of the additional columns will be redundant and will not be energized. However, if a gap should remain between the lines traced by adjacent chips, the additional elements can introduce additional lines to fill that gap at a position approximating the uniform spacing of the lines traced by the main M·N arrays.

Assuming that the M rows and N columns of laser emitting elements of the main array do not include any elements that are normally redundant, the spacing between adjacent lines in the set will be equal to $A_r/M$, namely the spacing of the adjacent elements in each row divided by the number of rows. Furthermore, because in some embodiments of the present disclosure no intentional overlap is provided between the two sets of M·N lines traced by any two adjacent chips, the total number of lines traced by the two chips will equal 2·M·N, namely twice the product of the number of rows and the number of columns in each chip, if the chips have equal numbers of rows and columns respectively.

Were the imaging surface moved relative to laser beams emitted by adjacent laser elements, the laser radiation centered on each line traced in the X-direction, would have a non-uniform energy profile which typically, but not necessarily, approaches a Gaussian intensity distribution. The spot size traced can be made large enough so that the energy traced by one laser element overlaps the area traced by an adjacent element and the intensity combination of the two beams, as well as the control over the amplitude of one or both beams, offers a combined intensity profile whose maximum may be moved between the two adjacent traced lines by controlling the relative intensity, and/or timing, thus placing an intermediate line traced at a selectable position between the two original line centers. It should be noted that this effect is thermally dynamic and additive provided that the adjacent spots are irradiated within a finite time of each other. In other words, the imaging surface should not have time to dissipate the energy of the first laser pulse in the interval between the two laser pulses.

In the event of an unintentional overlap between the two sets of M·N lines traced by the elements of adjacent chips, some of the elements of the main arrays can be switched off and if necessary replaced by an element of the additional columns to maintain the appearance of a raster with uniformly spaced lines. The interaction of energies from nearby laser elements within the main array can also be used in a same manner to compensate for missing or inoperative elements in a gap between them.

It has been found particularly advantageous for all the laser beams emitted by one chip to be focused on the imaging surface by a common single lens, or a common set of lenses arranged in series, having a magnification Mo whose absolute value is greater than or equal to one (1), however magnification lower than one (1) is also explicitly considered. It was found to be even more advantageous if the magnification Mo was substantially equal to +1, as that would ensure that the laser elements can be spaced adequately on the chip even for high resolution systems. Stated differently, the image of the array of laser elements on the imaging surface (i.e. an array of dots) would have the same size as the array on the chip, though it may be inverted with a magnification of −1. Notably, even if a slight misalignment of the lenses exists, such as GRIN rod (Gradient-Index) lenses, in the XY plane perpendicular to the optical axis of the lens, the position of the illuminated laser spot on the imaging surface will remain unchanged, as it only depends on the position of the laser emitting element on the laser array chip. The former elements can be positioned with very high accuracy on every laser array chip using standard semiconductor manufacturing techniques.

The lens elements of the imaging device, exemplified herein by GRIN rods, can be used in integral form, by which it is meant that the laser light passes through a single element in the light path from the laser source to the imaging surface. Alternatively, each light path may comprise two or more lens elements arranged in series, the separate elements being coupled to one another by reflecting elements, such as by mirrors or prisms, so as to produce the same effect as a lens element. The use of multiple lens elements is to allow the light path to be folded so as to simplify packaging, where the fold is in the space where a beam emitted by the laser elements is substantially individually collimated. For this reason, the separate elements will not typically be aligned with one another in a straight line. In other words, a laser beam emitted from the same element on a chip can target a similar location on the imaging surface, whether conveyed by an integral lens element (e.g., a single "straight" GRIN rod) or by a series of lens elements (e.g., two or more GRIN rods, with the light being "folded" and directed from each to the next by an associated or common reflecting element).

In folded light path embodiments, a reflecting member such as a prism or mirror which is optionally common to all the chips may serve to direct the laser beams from one GRIN rod element to the next in each series. In such a folded light path configuration, it is desirable for the reflecting member to be on a facet of a folding prism made of a material, typically a glass, having a higher refractive index than the highest refractive index in the GRIN rods. The higher index of refraction of the prism will limit the angular divergence of the collimated beams and allow larger separation between the sequential GRIN rod segments. A suitable light path folding prism can be for example a right angle prism, the folding face of the prism being a reflecting surface. Other types of reflecting members and folding angles can be used depending on the geometry of the system and the direction to be given to beams in the series.

Any relative movement of the imaging surface and the coating station is considered equivalent to a movement of the imaging surface.

BRIEF DESCRIPTION OF THE DRAWINGS

Some embodiments of the imaging device are described herein with reference to the accompanying drawings. The description, together with the figures, makes apparent to a person having ordinary skill in the pertinent art how the teachings of the disclosure may be practiced, by way of non-limiting examples. The figures are for the purpose of illustrative discussion and no attempt is made to show structural details of an embodiment in more detail than is necessary for a fundamental and enabling understanding of the disclosure. For the sake of clarity and simplicity, some objects depicted in the figures may not be drawn to scale.

In the Figures.

DETAILED DESCRIPTION

Overall Description of an Exemplary Printing System

Figure 1:
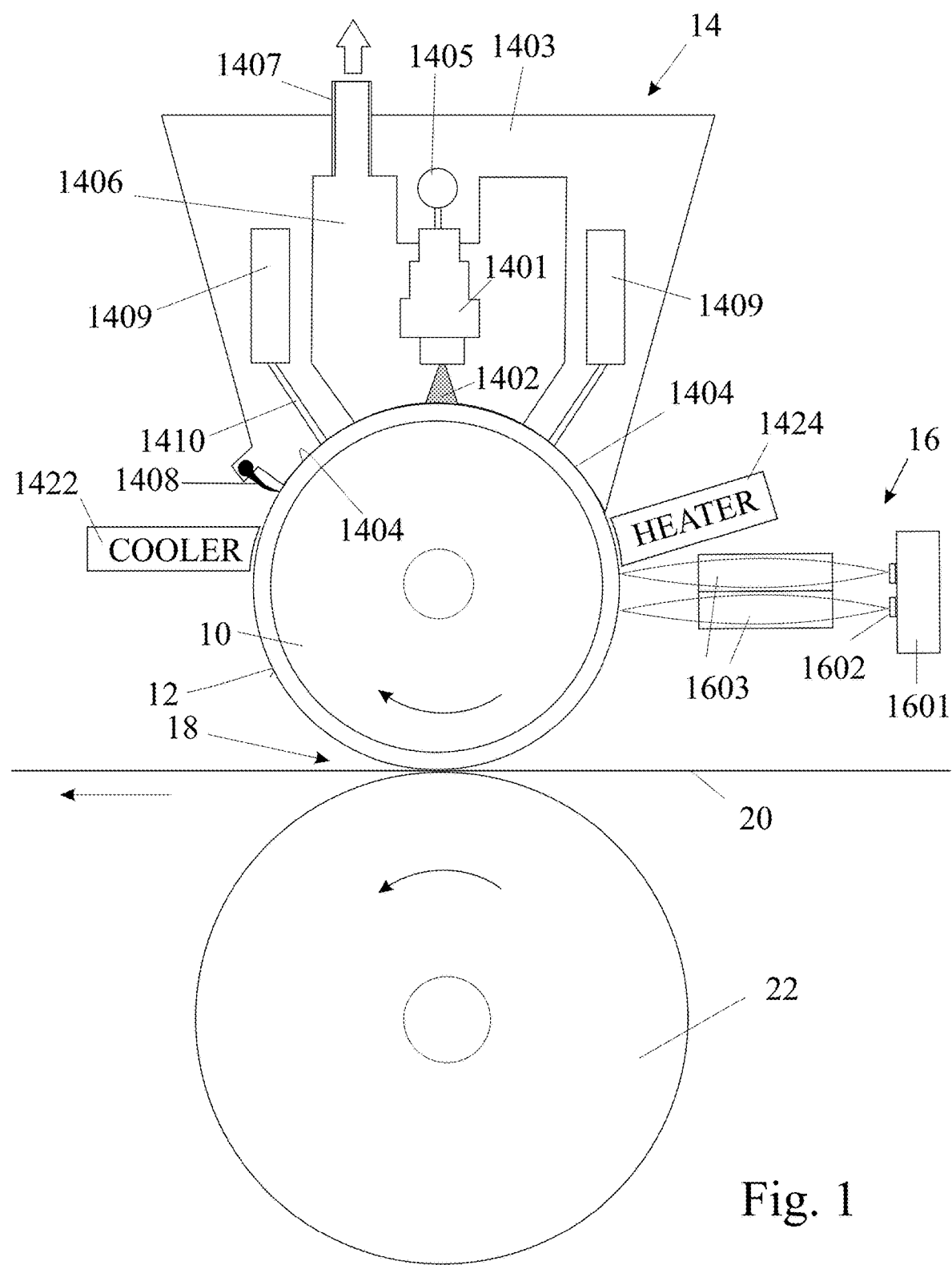
FIG. 1 depicts schematically a first embodiment of a printing system.

FIG. 1 shows a drum 10 having an outer surface 12 that serves as an imaging surface. As the drum rotates clockwise, as represented by an arrow, it passes beneath a coating station 14 where it acquires a monolayer coating of fine particles. After exiting the coating station 14, the imaging surface 12 passes beneath an imaging station 16 where selected regions of the imaging surface 12 are exposed by an imaging device to laser radiation, which renders the particle coating on the selected regions of the imaging surface 12 tacky. Next, the imaging surface 12 passes through an impression station 18, having a nip indicated by an arrow, where a substrate 20 is compressed between the drum 10 and an impression cylinder 22. The pressure applied at the impression station 18 causes the selected regions of the coating on the imaging surface 12 that have been rendered tacky by exposure to laser radiation in the imaging station 16, to transfer from the imaging surface 12 to the substrate 20. The regions on the imaging surface 12 corresponding to the selected tacky areas transferred to the substrate 20 consequently become exposed, being depleted by the transfer of particles. The imaging surface 12 can then complete its cycle by returning to the coating station 14 where a fresh monolayer particle coating is applied to the exposed regions from which the previously applied particles were transferred to the substrate 20 in the impression station 18. As detailed below, the substrate, also termed printing substrate, may be made of various materials (e.g., paper, cardboard, plastics, fabrics etc.), some optionally existing in coated and uncoated form depending on desired characteristics, and can be supplied to the impression station in different forms (e.g., as sheets or continuous webs).

The thermoplastic polymeric particles selectively exposed to laser radiation so as to be transferred to the substrate are said to form a film, or as further detailed hereinafter a polymer film. As used herein, the term "film" indicates that each spot of particle(s) exposed on the imaging surface may form a thin layer or coating of material, which may be flexible at least until transfer to the substrate at the impression station. The term "film" does not necessitate spots of adjacent particles exposed to laser radiation at the imaging station to collectively transfer as a continuous coating. It is believed that a thin film formed on the imaging surface (i.e. by one or more adjacent particles sufficiently exposed to a laser beam) may at most retain its thickness or become even thinner upon impression. Hence the printing apparatus and method according to the present teachings advantageously enable the printing on a substrate of a thin layer of irradiated particles. In some embodiments, the printed film can have a thickness of 1 micrometer or less, or of no more than 800 nm, or of no more than 600 nm, or of no more than 400 nm, or of no more than 200 nm, or even of no more than 100 nm.

The Coating Station

The coating station 14 may comprise a plurality of spray heads 1401 that are aligned with each other along the axis of the drum 10 and only one is therefore seen in the section of FIG. 1. The sprays 1402 of the spray heads are confined within a bell housing 1403, of which the lower rim 1404 is shaped to conform closely to the imaging surface leaving only a narrow gap between the bell housing 1403 and the drum 10. The spray heads 1401 are connected to a common supply rail 1405 which supplies to the spray heads 1401 a pressurized carrier fluid (gaseous or liquid) having suspended within it the fine particles to be used in coating the imaging surface 12. If needed the suspended particles may be regularly or constantly mixed, in particular before their supply to the spray head(s). The particles may be circulated in the coating apparatus at any suitable flow rate, generally not exceeding 50 liter/min, and by way of example within a flow rate range of 0.1 to 10 liter/minute, or in the range of 0.3 to 3 liter/min. The fluid and the surplus particles from the sprays heads 1401, which are confined within a plenum 1406 formed by the inner space of the housing 1403, are extracted through an outlet pipe 1407, which is connected to a suitable suction source represented by an arrow, and can be recycled back to the spray heads 1401. Though herein referred to as spray heads, any other type of nozzle or orifice along the common supply pipe or conduit allowing applying the fluid suspended particles are encompassed.

Figure 2:
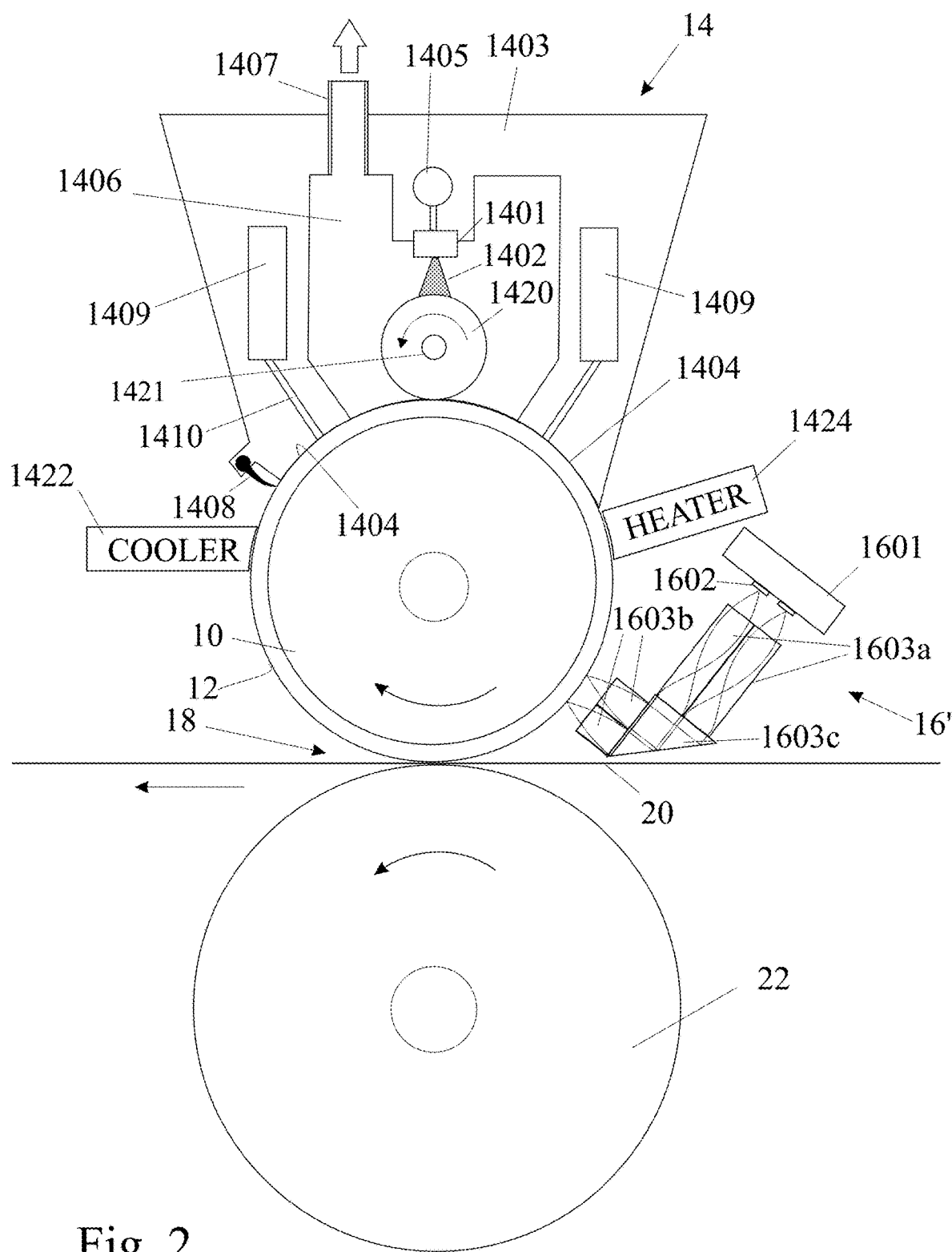
FIG. 2 depicts schematically a second embodiment of a printing system.

As an alternative to the above-described direct spraying of the fluid and suspended particles onto the imaging surface, the coating station, as shown in FIG. 2 may comprise a rotatable applicator 1420 operative to wipe the fluid and suspended particles onto the surface. The applicator 1420 may for example be a cylindrical sponge or may comprise a plurality of flexible strips extending radially from a rotatable axle. The material of the spongy roller or the strips is to be "relatively soft", selected so as to wipe the particles on the imaging surface 12, without affecting the integrity of the coat thereupon formed, in other words without scratching the layer of particles. The surface of the applicator, or of its bristles or stripes, may suitably comprise a closed cell foam (such as closed cell polyethylene, closed cell PVA or closed cell silicone); or a relatively soft open cell foam (such as a polyurethane foam); or a fabric, such as cotton, silk or ultra high molecular weight polyethylene (UHMWPE) fabric.

The fluid comprising the suspended particles may be supplied externally to such applicator 1420, in the manner shown in FIG. 2, as a spray or a jet 1420 from nozzles 1401, which may be embodied as simply as holes in the wall of a pipe, but more precise and/or evenly distributing embodiments are also considered. Alternatively, the fluid and suspended particles may be supplied internally. In such an embodiment, the fluid may be provided by a supply duct, or spray, positioned within the applicator, for instance, within or in parallel with the axis 1421, and diffuse through the material of the applicator 1420 towards its external surface.

The particle supply system is a conduit for supplying the required particles, and may be implemented internally to the printing device or to a coating housing therewithin, or as an external supply system which transports appropriate particles to the coating device.

The applicator may serve to remove, at least partially, any particles that are not in direct contact with the imaging surface and optionally at least partially flatten the particles coated on the surface as a monolayer.

Advantageously, a monolayer of particles facilitates the targeted delivery of radiation as emitted by the laser elements of the imaging station. This may ease the control of the imaging device, as the selectively irradiated particles reside on a single defined layer, which may facilitate focusing the laser radiation to form upon transfer to a substrate a dot of approximately even thickness and/or relatively defined contour.

Another advantage of having a monolayer is that it can provide for good thermal coupling between the particles and the imaging surface on which the particles are coated. The imaging surface may be a heat absorbing substrate or made of a suitably heat absorbing material, thus easing the transfer of energy from the imaging surface to the polymer particle (s) to render them tacky. It should be mentioned that because of the very small thickness of the particles, most of the laser energy can pass through them without being absorbed. Instead of heating the particles directly, the laser radiation tends instead to heat the imaging surface and the particles are heated indirectly.

As the intermediate applicator 1420 (e.g., roller or brush) rotates about its axis 1421, it applies the particles upon contact with the imaging surface 12 of drum 10. The outer surface of the applicator need not have the same linear velocity as the imaging surface and it can, for instance, be up to about ten-times higher. It may rotate in the same direction as drum 10 or in counter-direction. The applicator may be independently driven by a motor, or driven by drum 10 by gears, belts, friction, and the like.

In some embodiments, the surplus extraction system, that serves to remove particles that are not in direct contact with the surface, is configured similarly to the applicator. In such embodiments, the fluid that is externally or internally supplied to the applicator-like surplus extraction element to serve as a remover of excess particles, does not itself have any particles suspended within it. The fluid of the surplus extraction system, which may be regarded as a cleaning device, may be the same or different from the fluid in which the particles are suspended for the application device. For instance, particles may be applied while suspended in water or any other aqueous medium, and excess thereof may be removed by the same aqueous medium or by a different fluid, such as by an air stream.

Achieving an effective seal between the housing 1403 and the imaging surface 12 is important in order to prevent the particle carrying fluid and the fine particles from escaping through the narrow gap that remains between the housing 1403 and the imaging surface 12 of the drum 10. Different ways of achieving such a seal are shown schematically in the drawings.

The simplest form of seal is a wiper blade 1408. Such a seal makes physical contact with the imaging surface and could score the applied coating if used on the exit side of the housing 1403, that is to say the side downstream of the spray heads 1401. For this reason, if such a seal is used, it is preferred for it to be located only upstream of the spray heads 1401 and/or at the axial ends of the housing 1403. The terms "upstream" and "downstream" as used herein are referenced to points on the imaging surface 12 as it cycles through the different stations.

FIGS. 1 and 2 also show how egress of the fluid within which the particles are suspended from the sealing gap between the housing 1403 and the drum 10 can be prevented without a member contacting the imaging surface 12. A gallery 1409 extending in the present illustration around the entire circumference of the housing 1403 is connected by a set of fine passages 1410 extending around the entire rim of the housing 1403 to establish fluid communication between the gallery 1409 and the sealing gap.

In a first embodiment, the gallery 1409 is connected to a suction source of a surplus extraction system, which may be the same suction source as is connected to the outlet 1407 or a different one. In this case, the gallery 1409 serves to extract fluid passing through the gap before it exits the housing 1403. The low pressure also sucks off the drum 10 any particles that are not in direct contact with the imaging surface 12 and, if the sprayed fluid is a liquid, it also sucks off surplus liquid to at least partially dry the coating before it leaves the coating station 14. Surplus liquid can alternatively and additionally be removed by a liquid extracting roller (e.g., having a liquid absorbing surface) positioned on the exit side of the coating apparatus. Any such elements directed at drying the particle coating (e.g., a blower, a heater, a liquid extractor etc.), if present, can be internal to the coating device 14 (i.e., within plenum 1406 of housing 1403), or can alternatively be positioned downstream of the coating station, as long as it remains upstream of a station where the coating needs to be substantially dry. The drying element, if present, is advantageously compatible with the particle layer, and for instance does not negatively affect the particles and/or the integrity of the layer formed therefrom.

In an alternative embodiment, the gallery 1409 is connected to a source of gas at a pressure higher than the pressure in the plenum 1406. Depending on the rate of fluid supply to the plenum through the spray heads 1401 or other particle supply method and the rate of extraction through the outlet 1407, the plenum 1406 may be at a pressure either above or below the ambient atmospheric pressure.

If the plenum is maintained at sub-atmospheric pressure, then it suffices for the gallery 1409 to be at ambient atmospheric pressure, or indeed no gallery need be present. In this case, because the pressure within the sealing gap will exceed the pressure in the plenum 1406, gas flow through the gap will be towards the interior of the housing with no risk of fluid egress.

If the plenum is at above ambient pressure, then the gallery 1409 may be connected to a gas supply, preferably air, that is pressurized at higher pressure than the plenum pressure. In this case, air will be forced into the sealing gap under pressure through the passages 1410 and will split into two streams. One stream will flow towards the plenum 1406 and will prevent egress of the fluid within which the particles are suspended. That stream will also dislodge and/or entrain particles not in direct contact with the imaging surface and assist in at least partially drying the coating if the carrier fluid is a liquid. The second stream will escape from the coating station without presenting a problem as it is only clean air without any suspended particles. The second gas stream may also assist in further drying of the particle coating on the imaging surface 12 before it leaves the coating station 14. If desired, the gas stream can be heated to facilitate such drying.

In an alternative embodiment, the afore-mentioned gallery 1409 does not extend around the entire circumference of the housing, so as to seal the plenum chamber on all sides. It can be a "partial" gallery or a combination of one or more air knives (with negative or positive flow) positioned either downstream or upstream of the spray head(s) and/or intermediate applicator(s) in parallel to the axis of the drum and/or on the lateral edges of the spray heads and/or applicators in a direction perpendicular to the axis of the drum. A "partial" gallery on the exit side may, in some embodiments, serve as gas blower (e.g., cold or hot air) additionally or alternatively facilitating the drying of the particles, in which case the passages 1410 may be dimensioned to provide sufficient flow rate.

In one embodiment, and independently of the type of fluid carrying the suspended particles being applied to the imaging surface 12, a heater 1424 is provided on the exit side of the coating apparatus 14, and typically at an external downstream location as shown in FIGS. 1 and 2, the heater raising the temperature of the particle layer and the imaging surface before it reaches the imaging station 16. The temperature of the particles and the imaging surface may be raised by the heater from ambient temperature to above 30° C., or 40° C. or even 50° C., so as to reduce the amount of laser energy that is needed to render the particles tacky. However, the heating provided by the heater 1424 should not itself render the particles tacky and should not raise their temperature to above 80° C. or possibly to above 70° C. Such heating of the particles and imaging surface may be further facilitated by using a fluid carrier at an elevated temperature.

In some embodiments, a cooler 1422 may be provided on the entry side of the coating apparatus 14, and typically at an external upstream location as shown in FIGS. 1 and 2, the cooler lowering the temperature of the imaging surface 12 before the particle layer is being replenished in the previously exposed regions. It is believed that an imaging surface at a temperature of less than 40° C., or less than 30° C., or even less than 20° C., but typically above 0° C., or even above 10° C., can reduce the temperature of the particles neighboring the exposed regions so that by the time the imaging surface is being replenished, the so cooled particles may have no or reduced "residual tackiness", that is to say a partial softening insufficient for a subsequent step (e.g., transfer to a printing substrate). The cooled coating behaves in the same manner as the particles freshly deposited on the exposed regions of the imaging surface. In this manner, only particles selectively directly and/or indirectly targeted by any laser element of a chip of an imaging device as herein disclosed would become sufficiently tacky for transfer to a printing substrate. In the present context, indirect targeting of a particle indicates that a laser beam emitting element may target a radiation absorbing layer in the imaging surface underneath the targeted particle. Such cooling of the particles and imaging surface may be further facilitated by using a fluid carrier at decreased temperature.

Optionally, both a cooler 1422 on the entry side of the coating apparatus 14 and a heater 1424 on the exit side are provided, each cooler and heater operating as above described. Additionally, the drum 10 can be temperature controlled by suitable coolers/heaters internal to the drum, such temperature controlling arrangement being operated, if present, in a manner allowing the outer surface of the imaging surface, or portions thereof, to be maintained at any desired temperature.

The Particles

The shape and composition of the coating particles will depend in practice on the nature of the effect to be applied to the surface of the substrate 20. In a printing system, the particles may conveniently be formed of a pigmented thermoplastic polymer. Polymers and/or pigments associated therewith able to heat up and soften as a response to the irradiation wavelength of the laser beam emitting elements can be suitable. This need not be construed as limiting, as alternatively (and additionally) the particles may be rendered tacky by the laser elements as a result of the heating up of the imaging surface upon which they are applied.

For printing of high quality, it is desirable for the particles to be as fine as possible to minimize the interstices between particles of the applied monolayer coating. The particle size is dependent upon the desired image resolution and for some applications a particle size of 10 micrometer (μm) or possibly even larger may prove adequate. However, for improved image quality, it is preferred for the particle size to be a few micrometers and more preferably less than about 1 μm. In some embodiments, suitable particles can have an average diameter between 100 nm and 4 μm, 300 nm and 1 μm, in particular between 500 nm and 1.5 μm. On account of the manner in which such particles are produced, they are likely to be substantially spherical but that is not essential and they may be shaped as platelets.

Thus particle selection and ideal size determination, will depend upon the intended use of the particles, the effect sought (e.g., visual effect in the case of printing), and the operating conditions of the relevant coating and imaging stations. Optimization of the parameters may be done empirically, by routine experimentation, by one of ordinary skill in the art.

Depending on their shape, the particles may be characterized by their length, width, thickness, diameter or any such representative measurement of their X-, Y- and Z-dimensions. Typically such sizes are provided as average of the population of particles and can be determined by any technique known in the art, such as microscopy and Dynamic Light Scattering (DLS). In DLS techniques the particles are approximated to spheres of equivalent behavior and the size can be provided in terms of hydrodynamic diameter. DLS also allows assessing the size distribution of a population. As used herein, particles having a size of, for instance, 10 μm or less, have at least one dimension smaller than 10 μm, and possibly two or even three, depending on shape.

The particles are said to fulfill on average any desired size preference, if the D50 (50% of the population, e.g., by number or volume of particles) is about the intended size; whereas a population of particles wherein the D90 (e.g., $D_N90$, $D_V90$) is about the intended size implies a vast majority of particles (90% of the population) satisfy the same.

Though not essential, the particles may preferably be uniformly shaped and/or within a symmetrical distribution relative to a median value of the population and/or within a relatively narrow size distribution.

A particle size distribution is said to be relatively narrow if at least one of the two following conditions applies:

A) the difference between the hydrodynamic diameter of 90% of the particles and the hydrodynamic diameter of 10% of the particles is equal to or less than 150 nm, or equal to or less than 100 nm, or equal to or less than 50 nm, which can be mathematically expressed by: (D90−D10)≤150 nm and so on; and/or B) the ratio between a) the difference between the hydrodynamic diameter of 90% of the particles and the hydrodynamic diameter of 10% of the particles; and b) the hydrodynamic diameter of 50% of the particles, is no larger than 2.0, or no larger than 1.5, or no larger than 1.0, which can be mathematically expressed by: (D90−D10)/D50≤2.0 and so on.

As mentioned, such relatively uniform distribution may not be necessary for certain applications. For instance, having a relatively heterogeneously sized population of particles may allow relatively smaller particles to reside in interstices formed by relatively larger particles.

The particles may have any suitable aspect ratio, i.e., a dimensionless ratio between the smallest dimension of the particle and the equivalent diameter in the largest plane orthogonal to the smallest dimension. The equivalent diameter can be for instance the arithmetical average between the longest and shortest dimensions of that largest orthogonal plane. Such characteristic dimensions are generally provided by the suppliers of such particles and can be assessed on a number of representative particles by methods known in the art, such as microscopy.

Depending on their composition and/or on the processes they undergo (e.g., milling, recycling, burnishing etc.), the particles can be hydrophobic with different degrees, if any, of hydrophilicity. As the balance between the hydrophobic and hydrophilic nature of the particles may shift with time, the process is expected to remain efficient if the hydrophobic nature of the particles predominates. In the present disclosure such particles are said to be hydrophobic or substantially hydrophobic. It is envisaged that the particles will be carried by either a gaseous or a liquid fluid when they are sprayed onto the imaging surface or upon the intermediate applicator(s). When the particles are suspended in a liquid, in order both to reduce cost and minimize environmental pollution, it is desirable for the liquid to be aqueous. In such a case, it is desirable for the polymer used to form the particles to be hydrophobic, so that blowing a gas stream over the coating will both serve to dislodge and/or entrain particles not in direct contact with the imaging surface and to at least partially dry the coating on the imaging surface.

It is possible to apply to the substrate 20 an effect similar to foil blocking, where the printed image transferred to the substrate has metal-like reflectivity. This may be achieved using particles that are metallic or metal-like (e.g., made of a polymeric or ceramic material having a metallic appearance) and are coated with a clear thermoplastic polymer. Because of the manner in which metallic particles are produced (commonly by milling), they tend to be flat platelets and though not essential this enables highly reflective coatings of near mirror quality to be achieved. Such particles lend themselves to being burnished or polished which may be carried out while they are on the imaging surface 12 either by the use of high pressure during the spraying or by a burnishing roller. Though not shown in the drawing, a burnishing roller may be positioned downstream of the spray heads or other particle applicator. Burnishing is of particular advantage when operating the spray head(s) of the coating apparatus at relative low pressure and/or when including an intermediate applicator. A burnisher may be positioned in the same housing as previously described or in a separate housing. Burnishing of the monolayer of particles is advantageously carried out, when desired, before the coating reaches the imaging station, i.e. while the particles are still on the imaging surface, but this need not necessarily be the case as some printing system may benefit from burnishing of the particles following their transfer to the substrate. Burnishing may be carried out with a dry roller or with a wet roller (e.g., impregnated and/or washed with the particles' vehicle, for instance water). In the event an intermediate applicator is used it may, in addition to applying the particles to the imaging surface, also act to partly burnish them.

The outer surface of the optional burnishing roller may rotate at a linear speed different than that of the imaging surface of the drum and/or of the outer surface of an intermediate applicator, if present. It can rotate in the same or counter-direction relative to the drum.

The Particle Carrier

The particle carrier, that is to say the fluid within which the particles are suspended, may be either a liquid or a gas. If liquid, the carrier is preferably water based and if gaseous the carrier is preferably air. In the interest of economy, surplus particles extracted from the interior of the plenum of a housing may be recycled to the supply and/or applicator device.

The Imaging Surface

The imaging surface 12 in some embodiments is a hydrophobic surface, made typically of an elastomer that can be tailored to have properties as herein disclosed, generally prepared from a silicone-based material. The silicone-based surface may have any thickness and/or hardness suitable to bond the intended particles. The suitable hardness is to provide a strong bond to the particles when they are applied to the imaging surface 12 in the coating station 14, the bond being stronger than the tendency of the particles to adhere to one another. It is believed that for relatively thin imaging surfaces (e.g., 100 μm or less), the silicone-based material may have a medium to low hardness; whereas for relatively thick imaging surfaces (e.g., up to about 1 mm), the silicone-based material may have a relatively high hardness. In some embodiments, a relatively high hardness between about 60 Shore A and about 80 Shore A is suitable for the imaging surface. In other embodiments, a medium-low hardness of less than 60, 50, 40, 30, 20 or even 10 Shore A is satisfactory. In a particular embodiment, the imaging surface has a hardness of about 30-40 Shore A.

The hydrophobicity enables the tacky film created by exposing the particles to radiation to transfer cleanly to the substrate without splitting. A surface is said to be hydrophobic when the angle formed by the meniscus at the liquid/air/solid interface, also termed wetting angle or contact angle, exceeds 90°, the reference liquid being typically distilled water. Under such conditions, which are conventionally measured using a goniometer or a drop shape analyzer and can be assessed at a given temperature and pressure of relevance to the operational conditions of the coating process, the water tends to bead and does not wet, hence does not adhere, to the surface.

Advantageously, an imaging surface suitable for use with a printing system herein disclosed may be flexible enough to be mounted on a drum, appropriately extendible or unextendible if to be mounted as a belt, have sufficient abrasion resistance and/or resilience, be inert to the particles and/or fluids being employed, and/or be resistant to any operating condition of relevance (e.g., irradiation, pressure, heat, tension, and the like).

In particular, the composition forming the outer coat of the imaging surface, hereinafter the release layer, can be able to absorb radiant energy at the wavelength of the laser emitting elements. For instance, if the radiation is emitted in any portion of the near infrared (NIR) range within about 800-2,000 nm, then the release layer preferably absorbs over at least such portion of the NIR spectrum. In such case, the heating up of the imaging surface outermost layer can assist in the softening of the particles disposed thereupon, sufficient heating rendering the particles suitably tacky so as to transfer to a printing substrate upon impression. As previously mentioned, in some embodiments, the desired tackiness can be achieved by using particles comprising a polymer and/or a pigment being tuned to the wavelengths of the laser elements of the imaging device, so as to directly heat up and soften upon exposure to the laser, and by selecting a suitable imaging surface.

Advantageously, when desired tackiness is to be promoted, enhanced or achieved by proper selection of the imaging surface, the material forming the outer coat of the surface is such that it may absorb over a relatively wide range of laser wavelengths, compatible with different types of particles, each eventually having a different sub-range, even minute ones, of laser absorbance. Carbon black, which has a broad absorption and is a strong absorber in the NIR region, can be used to provide desired corresponding properties to the absorbing layer of the imaging surface. Incorporation of carbon black into silicone-based layers may also contribute to the thermal conductivity of the imaging surface and allows to modulate it, if and as desired.

The imaging surface 12 in the drawing is the outer surface of a drum 10, which can be either directly cast thereupon or mounted as a sleeve separately manufactured. This, however, is not essential as it may alternatively be the surface of an endless transfer member having the form of a belt guided over guide rollers and maintained under an appropriate tension at least while it passes through the coating station. Additional architectures may allow the imaging surface 12 and the coating station 14 to be in relative movement one with the other. For instance, the imaging surface may form a moveable plan which can repeatedly pass beneath a static coating station, or form a static plan, the coating station repeatedly moving from one edge of the plan to the other so as to entirely cover the imaging surface with particles. Conceivably, both the imaging surface and the coating station may be moving with respect to one another and with respect to a static point in space so as to reduce the time it may take to achieve entire coating of the imaging surface with the particles dispensed by the coating station. All such forms of imaging surfaces can be said to be moveable (e.g., rotatably, cyclically, endlessly, repeatedly moveable or the like) with respect to the coating station where any such imaging surface can be coated with particles (or replenished with particles in exposed regions).

The transfer member, whether formed as a sleeve over a drum or a belt over guide rollers, may comprise in addition to the imaging surface, on the side opposite the release layer, a body. The transfer member body may comprise different layers each providing to the overall transfer member one or more desired property selected, for instance, from mechanical resistivity, thermal conductivity, compressibility (e.g., to improve "macroscopic" contact between the imaging surface and the impression cylinder), conformability (e.g., to improve "microscopic" contact between the imaging surface and the printing substrate on the impression cylinder) and any such characteristic readily understood by persons skilled in the art of printing transfer members.

The Imaging Station

Figure 3:
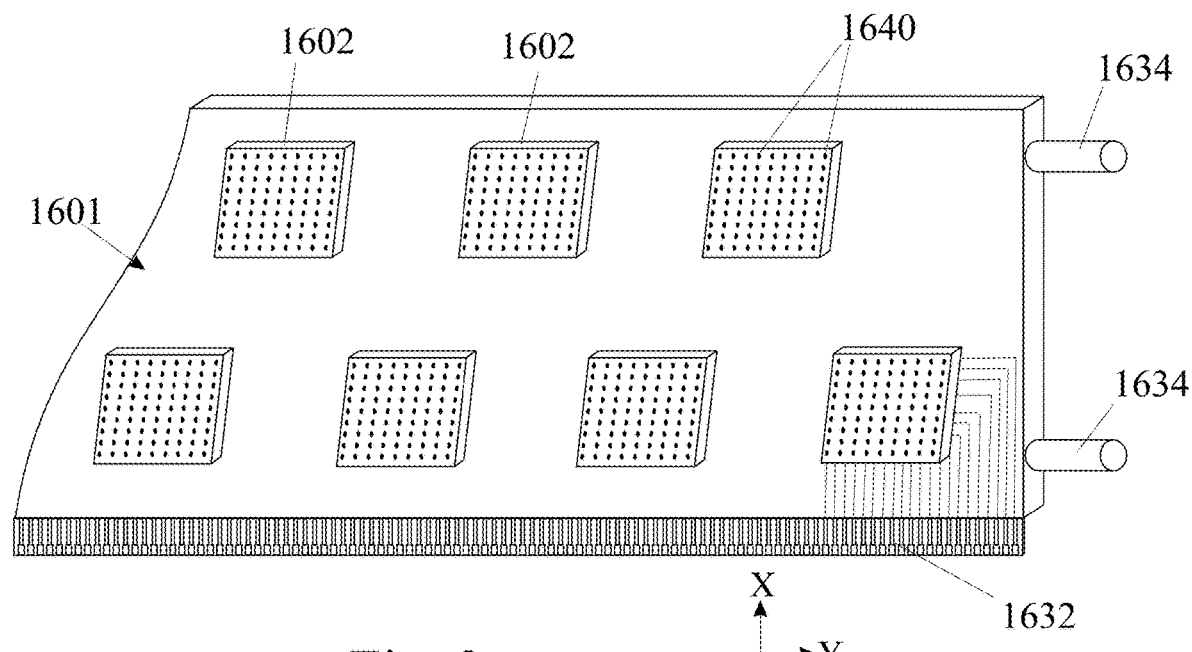
FIG. 3 shows part of an imaging device comprising a set of VCSEL chips mounted on a support, according to one embodiment of the invention.
Figure 4:
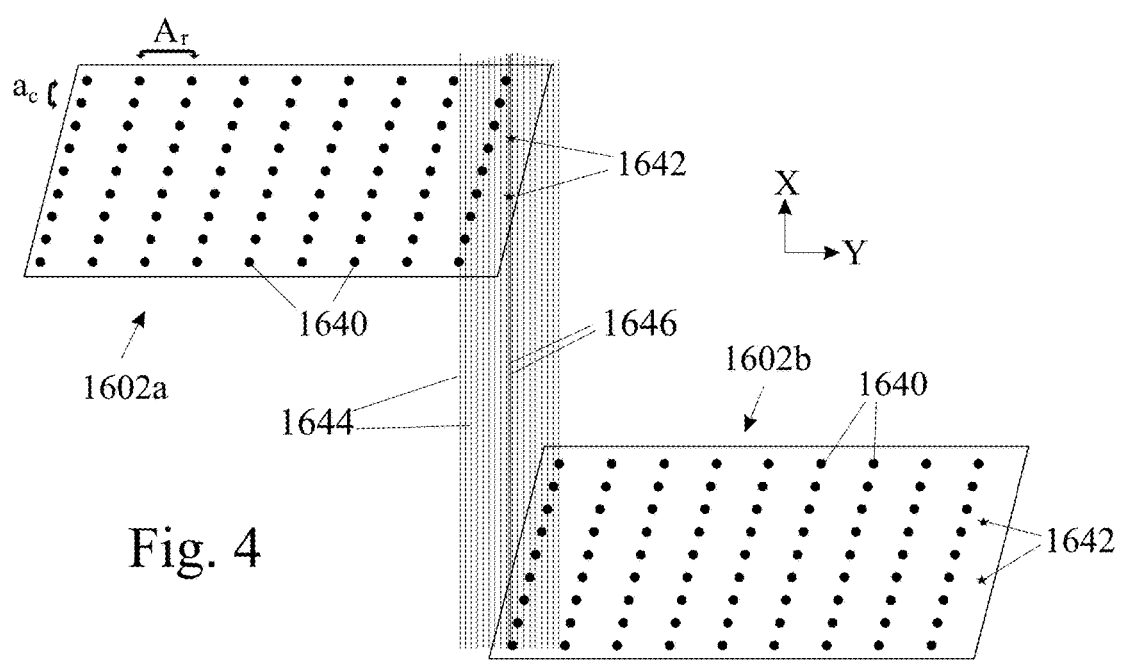
FIG. 4 is a schematic representation of the laser emitting elements of two VCSEL chips and the lines that they can trace on a relatively moving imaging surface.
Figure 5:
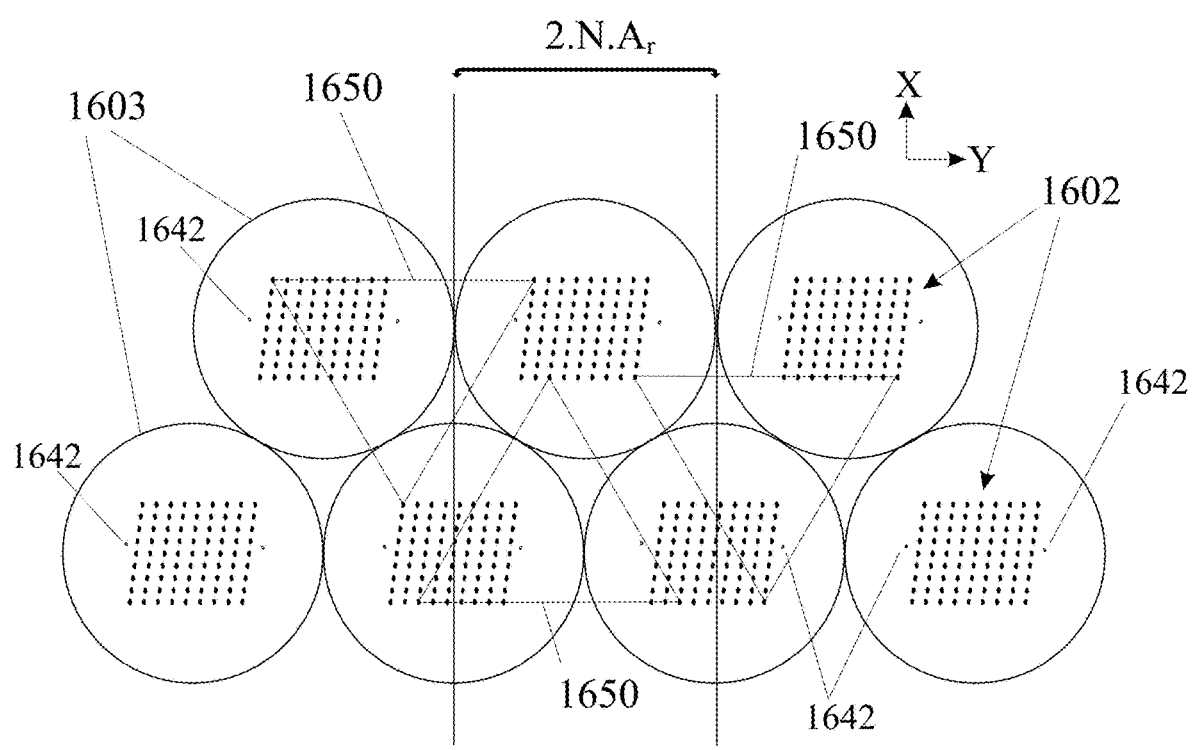
FIG. 5 is a schematic representation that demonstrates in one pair of rows the alignment between the VCSEL chips and the GRIN rods used as lenses to focus the emitted laser beams onto the imaging surface. The figure also depicts more clearly columns in additional to the main arrays of the chip, for compensating for placement errors.

The imaging device 16 in FIG. 1 is composed of a support 1601 carrying an array of chips 1602 each having an arrangement of individually controllable laser sources capable of emitting laser beams. While in some embodiments, the laser beam emitting elements can be of the vertical cavity surface emitting laser (VCSEL) type, forming VCSEL chips, other types of laser sources may be equivalently utilized. By way of example certain types of lasers such as $CO_2$ type and others may be better suited for certain embodiments. However, for brevity the term VCSEL should be construed as encompassing any such laser sources. Preferably, the chips 1602 can be individually or collectively associated with an array of corresponding lenses 1603 that focus the laser beams on the imaging surface 12. FIGS. 3 to 5 provide more details on the chips according to certain embodiments of the invention and on the manner in which they may be mounted on the support and aligned with the lenses 1603.

In some embodiments, the laser beam emitting elements can be of high power, where the total power required can be of tens or hundreds of milliwatt (mW). By way of example, depending on the desired printing speed, the energy beams can provide powers of up to 10 mW, 100 mW and even 250 mW or higher. Thus thermal interaction between the elements requires careful consideration.

In FIG. 1, the imaging station 16 provides a way of selecting the regions of the particle coating applied to the imaging surface 12 that will transfer to the substrate 20 at the impression station 18. The imaging station 16 comprises a support 1601 carrying an array of laser sources such as VCSEL chips 1602 that are optionally arranged in pair(s) of rows in positions that are accurately predetermined relative to one another (e.g., in a staggered manner providing laser sources suitable to target points along the entire width of the substrate, within nominal distance and tolerances of one another, and the like). Laser beams emitted by the chips 1602 are focused by lens system 1603, which may conveniently have a magnification of +1 or −1, though magnifications having an absolute value greater or lower than one (1) are also explicitly considered. The lens system may be constructed as two or more corresponding rows of GRIN (Gradient Index) rod lenses (each chip 1602, and all laser elements thereupon, being associated with a corresponding focusing lens 1603). Signals supplied to the chips for the activation of one or more laser element are synchronized with the rotation of the drum so as to allow a high resolution image to be traced on the imaging surface 12 by the emitted laser beams. The effect of the irradiation of each pixel by a laser beam is to make the particle at that pixel tacky so that it may later transfer to the substrate 20 when it is pressed against it at the impression station 18. The presence of a plurality of laser emitting elements facilitates the formation of an image comprising various pixels (picture elements) or lines thereof The duration of activation of each laser affects the resulting size of the film transferred to the substrate surface, an intermittent or continuing activation of one laser element being for instance capable of respectively tracing an individual pixel or a line of pixels in the image area of an imaging surface in relative motion. Clearly in operation the laser emitting elements are switched on and off as needed to provide the required image on the imaging surface, as continuous operation of all laser beams would result in a substantially uniformly irradiated surface.

FIG. 3 shows the support 1601 on which are mounted a plurality of VCSEL chips 1602 arranged in two rows in accurately predetermined positions relative to one another, as will be described in more detail by reference to FIG. 4.

The support 1601 is a rigid and in some embodiments at least partially hollow elongate body fitted with connectors 1634 to allow a cooling fluid to flow through its internal cavity to cope with the significant amount of heat that may be generated by the chips 1602. In certain embodiments, the body of the support may be made of an electrically insulating material, such as a suitable ceramic, or it may be made of a metal and at least its surface on which the chips 1602 are mounted may be coated with an electrical insulator. This enables a circuit board made of thin film conductors (partial and symbolic depiction of the conductors is schematically shown to the lower-right chip at FIG. 3) to be formed on the surface. The chips 1602 are soldered to contact pads on this circuit board and a connector 1632 projecting from the lower edge of the support 1601 allows control and power signals to be applied to the chips 1602. The laser emitting elements 1640 of each chip 1602 are individually addressable and are spaced apart sufficiently widely to minimize thermal interference with one another.

FIG. 4 shows schematically, and to a much enlarged scale, the relative positioning of two laser emitting element arrays of chips 1602a and 1602b that are adjacent one another in the Y-direction but are located in different rows. Each of the chips has a main array of M by N laser emitting elements 1640, as previously described, which are represented by circular dots. In the example illustrated, M and N are equal, there being nine rows and nine columns. Having equal numbers of rows and columns in each chip permits the design of the optics to be optimized. The spacing between the elements in a row, designated $A_r$, and the spacing between the elements in a column, designate $a_c$, are shown as being different from one another but they may be the same. The array is shown as being slightly skewed so that the columns and rows are not perpendicular to one another. Instead, the rows lie parallel to the Y-direction while the columns are at a slight angle to the rows. This enables lines, such as the lines 1644, traced by the elements 1640 on the imaging surface, if energized continuously, to be sufficiently close together to allow high resolution images to be printed. FIG. 4 shows that the element at the end of each row traces a line that is a distance $A_r/M$ away from the line traced by the corresponding element of each adjacent row, the separation between these lines being the image resolution $I_r$. Thus, assuming a magnification of |1|, $A_r$ and M are selected in dependence upon the desired image resolution, based on the equation $A_r=M \cdot I_r$. By "corresponding elements" it is meant that the individual laser emitting elements of the M·N main array should occupy the same row and/or column positions with respect to elements of adjacent columns and/or rows within their respective chips. In the context of adjacent chips, corresponding elements occupy the same row and column position within their respective main arrays.

It is possible for the elements to lie in a square array where the columns are perpendicular to the rows. In this case, the chips would need to be mounted askew on their support and compensation would need to be applied to the timing of the control signals used to energize the individual elements.

As is clear from FIG. 4, the nominal positioning of the array 1602b is such that the line traced by its bottom left element 1640 should ideally also be spaced from the line traced by the top right element of the array 1602a by a distance equal to $A_r/M$. Therefore when all the elements 1640 of both arrays of chips 1602a and 1602b are energized, they will trace 2·M·N lines that will all be evenly spaced apart by a distance $A_r/M$ between adjacent lines, without any gaps.

If one wishes to provide compensation for defective elements, the array could include additional rows of laser emitting elements 1640, but it is alternatively possible to compensate for a defective element by increasing the intensity of the laser beams generated by the laser emitting elements that trace the two adjacent parallel lines.

Preferably, in addition to the M by N array of elements 1640, each chip has at least one additional column that is arranged along the Y-direction on the side of the main array, the additional column containing at least one laser beam emitting element 1642. These further elements 1642 are represented in FIG. 4 by stars, to distinguish them from the main array elements 1640. As seen in FIG. 5, in some embodiments at least two such additional columns each of one element 1642 are provided, at least one column disposed in Y direction on each side of the main M by N array. The additional laser elements of the additional columns on one or both sides of each main array, can be positioned at a distance of ½ or ⅓ the spacing between traced lines that can be imaged by the lenses onto the imaging surface. Furthermore additional elements could be placed in the gap between two arrays that nominally spans a distance of $A_r/M$ so that higher sensitivity is achieved in correcting the spacing errors between adjacent arrays.

Any additional element 1642 of an additional column can be positioned in the column at any desired distance from the edge element of the main array, the distance in the Y-direction depending on the total numbers of additional elements/additional columns each two sets of main arrays of a pair of chips to be aligned would bound. Assuming n additional elements 1642 between a first and second main array, n being a positive integer number, each additional element can be spaced from the edge element of the main arrays or from one another in the Y-direction by a distance equal to $A_r/(n+1)$, namely the spacing of the adjacent elements in each row divided by one more than the number of additional elements in the gap. Considering the X-direction, the additional elements can either be aligned with a row of elements of their respective main arrays or positioned at any desired intermediate position above or below such rows. Preferably the positioning of an additional element 1642 with respect to adjacent elements of the main array shall minimize thermal interference. Notably, the additional element or elements may be disposed at any position along the X-direction of the chip.

In practice n elements 1642 positioned in any of the additional columns on one or both sides of the main array, can correct for alignment errors of up to about a 1/(n+1) of the nominal spacing between the edge elements of two adjacent chips. If, by way of example, the edge elements of the two chips are at a distance of 20 μm (micrometers) in the Y-direction, and there is a single additional laser emitting element on adjacent sides of each array, such elements may correct a spacing error of up to about one third of the nominal spacing, in the exemplified case approximately 7 μm. Any positional deviation from the desired position on the chip (e.g., with respect to its edges) or nominal distance between elements not exceeding 10%, is considered within tolerances, however in most cases due to the high precision of the semiconductor manufacturing methods, such errors are unlikely.

As can be seen from FIG. 4, when activated, these elements 1642 trace two additional lines 1646 between the two sets of evenly spaces parallel lines 1644a and 1644b traced by the elements 1640 of the two chips 1602a and 1602b, respectively.

One of the additional lines 1646 is spaced by a distance $A_r/3M$ from the last adjacent line 1644 traced, for example, by the main array of chip 1602a in FIG. 4 and the other is spaced by a distance $A_r/3M$ from the first adjacent line 1644 traced, for example, by the main array of the chip 1602b. In the event of a misalignment between the two chips 1602a and 1602b these elements 1642 can be energized in addition to, or instead of some of, the elements 1640 of the main arrays to compensate for any misalignment between the arrays that tends to create a stripe in the printed image, be it a gap or a dark line resulting from an unintentional overlap.

While the two additional elements 1642 in the present embodiment of the disclosure are shown in FIG. 4 as tracing two separate lines 1646, the energies of these two elements can be combined on the imaging surface to form a single line of which the position is controllable by appropriate setting of the energies emitted by each of the additional elements 1646.

For the chips 1602a and 1602b in FIG. 4 to function correctly as described above, their relative position in the Y-direction is very important. In order to simplify the construction of the lens system serving to focus the emitted laser beams on the imaging surface it is advantageous to adopt a configuration shown in FIG. 5 which enables the two rows of lenses corresponding to a pair of chip rows to be self-aligning.

FIG. 5 shows arrays of seven adjacent chips 1602 each shown lined up with a respective lens 1603. Additional laser elements 1642, on each side of the main array, are also schematically illustrated in the figure. Each lens 1603 is constructed as a GRIN (Gradient-Index) rod, this being a known type of lens that is shaped as a cylinder having a radially graduated refractive index. In the case of the geometry shown in FIG. 5, the respective centers of corresponding elements of any three bi-directionally adjacent chips 1602 lie nominally on the apices of an equilateral triangle, three such triangles designated 1650 being shown in the drawing. It will be noted that all the triangles 1650 are congruent. As a result, if the diameter of the GRIN rods is now selected to equal $2 \cdot N \cdot A_r$, which is the length of the sides of the equilateral triangles 1650, or the nominal distance between the centers of corresponding laser emitting elements of adjacent VCSEL chips 1602 in the same row, then when stacked in their most compact configurations, after aligning the lens array to the Y-direction over the chips, the lenses 1603 will automatically align correctly with their respective chip. For such construction, the relationship between the rod lens diameter D, the image resolution $I_r$, and the size of the matrix of laser elements is: $D = 2I_r \cdot M \cdot N$ where $I_r$ is the spacing in the Y-direction between adjacent lines traceable in the X-direction and M is the number of rows and N the number of columns in the main M·N array, assuming absolute magnification value of |1|. In other words, certain embodiments utilize GRIN rods with a circular cross-section of diameter D, where $D = 2 \cdot Ar \cdot N$, and when packed in two rows without spacing the distance between the centers of any two adjacent GRIN rods also equals $2 \cdot Ar \cdot N$.

Though the lens 1603 has been schematically illustrated in FIG. 1 (side view) and FIG. 5 (cross section view) as being an individual GRIN rod, in alternative embodiments the laser beams of each chip can be transmitted by a series of lenses. In the simplified embodiment shown in FIG. 2, the single GRIN rod 1603 is replaced by two mutually inclined GRIN rods 1603a and 1603b and the light from one is directed to the other by a reflecting member which in the example of FIG. 2 is embodied by a prism 1603c of high refractive index glass, so that the light follows a folded path. It is noted that other reflecting members such as mirrors and the like may be utilized. Such a configuration enables coating stations in a color printing system to be arranged closer to one another in a more compact configuration and allows the irradiation of the coating on the imaging surface 12 to take place nearer the nip 18 of the impression station. Such a folded light path can adopt different configurations while fulfilling all the requirements of magnification and light transmission. To enable the light path to be split in this manner, the length of the GRIN rods is preferably selected such that light beams are individually collimated on leaving the rods 1603a and entering the rods 1603b as shown by the light rays drawn in FIG. 2.

The radiation guided by GRIN rod 1603a, the proximal end of which is arranged at a distance $WD_o$ from the chip 1602, may be captured by the corresponding GRIN rod 1603b which can collect the collimated light emerging from rod 1603a on the same light path and focus it at a distance $WD_i$, from the distal end of the second GRIN rod 1603b. When the two GRIN rods are made of the same material and the same radial gradient profile and $WD_o=WD_i$ a magnification of Mo=+1 or −1 can be obtained. Notably, with straight or folded path light paths, the magnification should be considered substantially equal to its nominal value if within ±0.5% or even 1% or 2%.

In some embodiments, the intensity of the laser beam emitted by each laser element of a chip may be adjustable either continuously (in an analogue manner) or in discrete steps (digitally). In one embodiment, the chips may include D/A converters so as to receive digital control signals. In this way, the laser beam intensity may be controllably adjusted in a plurality of discrete steps, such as 2, 4, 8, 16, 32, . . . and the like, and in some embodiments individual laser beam sources may be controllably set to emit up to 4096 levels or more.

The lowermost level of energy is defined as 0, where the individual laser element is not activated, the uppermost level of energy can be defined as 1. The distinct intermediate levels therebetween may be considered analogous in the field of printing to "grey levels", each level providing for a gradually distinct intensity (e.g., shade when considering a colored output). Taking for instance, a laser beam emitting element having 16 levels of activation, level 0 would result in lack of impression (e.g., leaving a substrate bare or white if originally so) and level 1 would result in transfer of a tacky film formed by a particle irradiated at maximum energy (e.g., forming a full black dot in the event the particles are so colored). In previous illustrative example, levels 1/16, 2/16, 3/16 and so on would correspond to increasingly stronger shades of grey, comprised between white (0) and black (1). Typically, the energy levels are evenly spaced.

In an alternative embodiment, the individually controllable laser elements of a chip can emit laser beams having variable energy that can be modulated in a continuous analogue manner.

Printing systems and methods incorporating such an imaging station further comprise control devices able to individually control the laser elements and the beams projected therefrom onto a moving imaging surface.

The energy profile of each dot is symmetrical with tapering sides. The exact profile is not important as the distribution may be Gaussian, sinusoidal or even an inverted V. In any such profile, as the peak intensity increases, the base widens and the area of intersection of the profile with a threshold at which the particle coating is rendered tacky also increases in diameter. A consequence of this energy distribution is that points of the imaging surface that are not in alignment with the centerline of any one laser emitting element will receive energy from adjacent elements. It is possible for two nearby elements to be energized to below the level needed to render coating particles on the centerline of the elements tacky, yet for the cumulative energy in the region of overlap between the two centerlines to rise above the level necessary to render the coating particles tacky. In this way, it is possible to create potential raster lines between the centerlines of the laser lines in addition to, or as an alternative to, the raster lines coinciding with the centerlines of the laser elements. This ability to combine the energies from adjacent elements is used to achieve different effects, as described herein. These effects are dependent upon the ability of the imaging surface to combine energies received from different laser elements, even if there is a slight difference between the times of irradiation.

In some embodiments, at least one pair of laser elements, selected either both from the same array or one from each of two adjacent arrays, are controlled in such a manner that their energies are combined on the imaging surface to increase the temperature of the imaging surface above a predetermined threshold at a point intermediate the centers of the images of the two laser elements on the imaging surface, without raising the temperature of the imaging surface at at least one of the centers of the images of the two laser elements above the latter threshold.

Once a region of the imaging surface or particles monolayer thereupon has reached a temperature at which the particles become tacky, any further increase in temperature will not have any effect on the transfer to the substrate. However, it should also be noted that as the intensity of the laser is increased the size of the dot that is rendered tacky also increases.

The imaging station 16 is shown in FIGS. 1 and 2 as being located upstream of the impression station and in an embodiment having such a configuration, it is important to ensure that the film on the imaging surface 12 does not lose its tackiness during transit between the imaging station and the impression station. This may be achieved by positioning the imaging station as closely as possible to the impression station. The imaging system of FIG. 2, that has a folded light path, assists in this respect.

It is alternatively possible to combine the imaging and impressions stations and to selectively heat the imaging surface 12 substantially at the same time as it is pressed against the substrate. This may be achieved, for example, by forming the drum 10 of a transparent material and locating the imaging system 16 within the drum or externally to the drum and across it at a position "facing" the impression station. By "transparent" it is meant that the material of the drum and/or of the imaging surface does not significantly affect the irradiation of the selected particles and/or allow the transfer of sufficient power to render them tacky.

The digital printing system shown in FIG. 1 or FIG. 2 can only print in one color but multicolor printing can be achieved by passing the same substrate successively through multiple arrangements of coating, imaging and impression stations that are synchronized and/or in registration with one another and each printing a different color. In such case it may be desirable to provide substrate treating stations between the different coating stations. A treating station can be for instance a cooler able to reduce the temperature of the substrate on its exit of a previous impression station. As some transferred films may retain some residual tackiness to a degree that may impair a subsequent transfer of different particles, it may be advantageous to eliminate such residual tackiness by cooling of the film transferred to the substrate. Depending on the thermoplastic polymer, the elimination of any residual tackiness, or its reduction to a level not affecting the process, can alternatively be achieved by a treating station being a curing station.

Furthermore, a printing system, even if monochrome, may include a perfecting system allowing double-sided printing. In some cases, perfecting can be addressed at the level of the substrate transport system, which may for example revert a substrate to a side not yet printed on, and re-feed the unprinted side of the substrate to the same treating and impressions stations having served to print the first side. In other embodiments, perfecting can be addressed by including two separate impression stations (and their respective upstream or downstream stations), each impression station enabling printing on a different side of the same substrate.

The Substrate

The printing system shown in the drawing is not restricted to any particular type of substrate. The substrate may be individual sheets of paper or card or it may have the form of a continuous web. Because of the manner in which a thin film of softened polymeric particles is applied to the substrate, the film tends to reside on the surface of the substrate. This allows printing of high quality to be achieved on paper of indifferent quality. Furthermore, the material of the substrate need not be fibrous and may instead be any type of surface, for example a plastics film or a rigid board.

The Impression Station

The impression station illustrated in FIGS. 1 and 2 comprises only a smooth impression cylinder 22 that is pressed against the drum 10 and its outer imaging surface 12. The impression cylinder 22 may form part of a substrate transport system, in which case it may be equipped with grippers for engaging the leading edge of individual substrate sheets. In other than digital printing systems, the impression cylinder may have an embossed surface to select the regions of the particle coating to be transferred to the substrate 20.

In the description and claims of the present disclosure, each of the verbs, "comprise" "include" and "have", and conjugates thereof, are used to indicate that the object or objects of the verb are not necessarily a complete listing of members, components, elements, steps or parts of the subject or subjects of the verb.

As used herein, the singular form "a", "an" and "the" include plural references and mean "at least one" or "one or more" unless the context clearly dictates otherwise.

Positional or motional terms such as "upper", "lower", "right", "left", "bottom", "below", "lowered", "low", "top", "above", "elevated", "high", "vertical", "horizontal", "front", "back", "backward", "forward", "upstream" and "downstream", as well as grammatical variations thereof, may be used herein for exemplary purposes only, to illustrate the relative positioning, placement or displacement of certain components, to indicate a first and a second component in present illustrations or to do both. Such terms do not necessarily indicate that, for example, a "bottom" component is below a "top" component, as such directions, components or both may be flipped, rotated, moved in space, placed in a diagonal orientation or position, placed horizontally or vertically, or similarly modified.

Unless otherwise stated, the use of the expression "and/or" between the last two members of a list of options for selection indicates that a selection of one or more of the listed options is appropriate and may be made.

In the disclosure, unless otherwise stated, adjectives such as "substantially" and "about" that modify a condition or relationship characteristic of a feature or features of an embodiment of the present technology, are to be understood to mean that the condition or characteristic is defined to within tolerances that are acceptable for operation of the embodiment for an application for which it is intended, or within variations expected from the measurement being performed and/or from the measuring instrument being used. When the term "about" precedes a numerical value, it is intended to indicate +/−15%, or +/−10%, or even only +/−5%, and in some instances the precise value.

While this disclosure has been described in terms of certain embodiments and generally associated methods, alterations and permutations of the embodiments and methods will be apparent to those skilled in the art. The present disclosure is to be understood as not limited by the specific embodiments described herein.

The invention claimed is:

1. A method of printing a film onto selected regions of a surface of a substrate, which method comprises the steps of:
    a) providing a cyclically moveable transfer member having an imaging surface;
    b) providing a supply of individual particles formed of, or coated with, a thermoplastic polymer;
    c) coating the imaging surface of the transfer member with particles from the supply;
    d) removing particles that are not in direct contact with the imaging surface, so as to leave a uniform monolayer particle coating on the imaging surface;
    e) exposing selected regions of the coated imaging surface to radiation of sufficient power to render the particles tacky within the selected regions;
    f) pressing at least a portion of the coated imaging surface and at least a corresponding portion of the substrate surface against one another, either during or after irradiation, to cause transfer to the surface of the substrate of only the particles that have been rendered tacky; and,
    g) removing the particles remaining on the imaging surface after the transfer of the tacky particles to the substrate.

2. A method as claimed in claim 1, further comprising collecting at least some of the particles removed in step g), and recycling the collected particles for re-application to the imaging surface.

3. A method as claimed in claim 1, wherein the coating of the imaging surface of step b) is performed by at least one intermediate applicator.

4. A method as claimed in claim 1, comprising at least one of the further steps of:
    (i) heating the imaging surface prior to, or during, step e), and
    (ii) cooling the imaging surface subsequent to step f).

5. A printing apparatus for printing a film comprising a thermoplastic material onto selected regions of a surface of a substrate, the apparatus comprising:
    a) a moveable endless transfer member having an imaging surface;
    b) a coating station at which individual particles made of, or coated with, a thermoplastic polymer are applied to the imaging surface and at which particles not in direct contact with the imaging surface are removed therefrom, such that a uniform monolayer particle coating is formed on the imaging surface;
    c) an imaging station at which selected regions of the coated imaging surface are exposed to radiation of sufficient power to render the particles tacky within the selected regions, the imaging station comprising an imaging device for projecting individually controllable laser beams onto the imaging surface as the imaging surface moves in a reference X-direction relative to the imaging station, the imaging device having a plurality of semiconductor chips each having a plurality of laser beam emitting elements mounted on a support;

wherein the individually controllable laser beam emitting elements of each semiconductor chips are arranged in a two dimensional main array of M rows and N columns, the elements in each row having a uniform spacing $A_r$ and the elements in each column having a uniform spacing $a_c$, wherein the chips are mounted on a support in such a manner that, when nominally placed, each pair of chips that are adjacent one another in a reference Y-direction, transverse to the X-direction, are offset from one another in the X-direction, such that were all laser beams emitting elements to be activated continuously, and were the imaging surface in motion relative to the imaging station, the emitted laser beams would trace across the imaging surface a set of parallel lines that extend in the X-direction and are substantially uniformly spaced in the Y-direction; and the laser beams of each chip tracing a set of M·N lines that do not overlap the set of lines of the other chip; and, d) an impression station at which at least a portion of the coated imaging surface and at least a corresponding portion of the surface of the substrate are pressed against one another, either during or after irradiation, to cause transfer to the surface of the substrate of a tacky film formed on the selected regions of the imaging surface by exposure of the monolayer particle coating to radiation, wherein, during operation, after at least a portion of the transfer member has passed through the imaging and impression stations, the at least a portion of the transfer member which passed through the impression station is returned to the coating station wherein the particle coating on the imaging surface is replenished to a uniform monolayer.

6. A printing apparatus as claimed in claim 5, wherein the coating station comprises at least one intermediate applicator able to apply the particles to the imaging surface.

7. A printing apparatus as claimed in claim 6, wherein at least one of the at least one intermediate applicator includes a brush able to brush off at least part of the particles that are not in direct contact with the imaging surface.

8. A printing apparatus as claimed in claim 5, further comprising a particle supply for supplying the individual particles to the coating station.

9. A printing apparatus as claimed in claim 5, wherein the coating station comprises at least one of: at least one intermediate applicator and at least one spray head which is able to both apply the particles that are to be applied to the imaging surface and remove at least part of the particles that are not in direct contact with the imaging surface.

10. A printing apparatus as claimed in claim 5, wherein the imaging surface is hydrophobic and/or charged.

11. A printing apparatus as claimed in claim 5, wherein the particles are hydrophobic and/or charged.

12. A printing apparatus as claimed in claim 5, wherein the coating station comprises:

i. at least one spray head for directly or indirectly applying to the imaging surface a fluid stream within which the particles are suspended, ii. a housing surrounding the spray head and defining an interior plenum for confining the fluid stream, the housing having a rim adjacent to the imaging surface that is configured to prevent egress of particles from a sealing gap defined between the rim of the housing and the surface to be coated, and iii. a suction source connected to the plenum to extract from the plenum the sprayed fluid and particles suspended in the sprayed fluid, the suction source being operative to extract particles that are not in direct contact with the imaging surface, so as to leave only a single particle layer adhering to the imaging surface on exiting the coating station.

13. A printing apparatus as claimed in claim 12, wherein the fluid is a gas and/or the plenum is maintained at sub-atmospheric pressure.

14. A printing apparatus as claimed in claim 5, wherein the elements in each row of the main array of each chip lie on a line parallel to the Y-direction and the elements in each column of the main array of each chip lie on a straight line inclined at an angle to the rows.

15. A printing apparatus as claimed in claim 14, wherein the chips are arranged in pair of rows on the support and corresponding laser emitting elements of all the chips in each of the two rows lie in line with one another in the Y-direction.

16. A printing apparatus as claimed in claim 15, wherein the alignment of the chips within the two rows of the pair is such that the respective centers of corresponding elements in any group of three adjacent chips in the X and Y-directions lie nominally at the apices of congruent equilateral triangles.

17. A printing apparatus as claimed in claim 16, wherein a respective lens is provided for each chip to focus the laser beams emitted by all the elements of the associated chip onto the imaging surface.

18. A printing apparatus as claimed in claim 17, wherein each lens comprises a GRIN rod having a diameter of $2 \cdot N \cdot A_r$.

19. A method of printing a film onto selected regions of a surface of a substrate, which method comprises the steps of:

a) providing a cyclically moveable transfer member having an imaging surface;

b) providing a supply of individual particles formed of, or coated with, a thermoplastic polymer;

c) coating the imaging surface of the transfer member with particles from the supply;

d) removing particles that are not in direct contact with the imaging surface, so as to leave a uniform monolayer particle coating on the imaging surface;

e) exposing selected regions of the coated imaging surface to radiation of sufficient power to render the particles tacky within the selected regions;

f) pressing at least a portion of the coated imaging surface and at least a corresponding portion of the substrate surface against one another, either during or after irradiation, to cause transfer to the surface of the substrate of only the particles that have been rendered tacky; and, g) replenishing the monolayer of particles or portions thereof to produce uniform monolayer of particles on the imaging surface;

the method further comprising heating the imaging surface prior to, or during, step e).

20. A method of printing a film onto selected regions of a surface of a substrate, which method comprises the steps of:

a) providing a cyclically moveable transfer member having an imaging surface;
b) providing a supply of individual particles formed of, or coated with, a thermoplastic polymer;
c) coating the imaging surface of the transfer member with particles from the supply;
d) removing particles that are not in direct contact with the imaging surface, so as to leave a uniform monolayer particle coating on the imaging surface;
e) exposing selected regions of the coated imaging surface to radiation of sufficient power to render the particles tacky within the selected regions;
f) pressing at least a portion of the coated imaging surface and at least a corresponding portion of the substrate surface against one another, either during or after irradiation, to cause transfer to the surface of the substrate of only the particles that have been rendered tacky; and,
g) replenishing the monolayer of particles or portions thereof to produce uniform monolayer of particles on the imaging surface;
the method further comprising cooling the imaging surface subsequent to step f).

\* \* \* \* \*